United States Patent
Sekizaki et al.

(10) Patent No.: US 10,141,752 B2
(45) Date of Patent: Nov. 27, 2018

(54) DRAWBACK RESISTANT BATTERY MONITORING UNIT

(71) Applicants: Yazaki Corporation, Tokyo (JP); GS YUASA INTERNATIONAL LTD., Kyoto-shi, Kyoto (JP)

(72) Inventors: Masashi Sekizaki, Shizuoka (JP); Michito Enomoto, Shizuoka (JP); Tomoshige Inoue, Kyoto (JP)

(73) Assignees: YAZAKI CORPORATION, Minato-ku, Tokyo (JP); GS YUASA INTERNATIONAL LTD., Kyoto-shi, Kyoto (JP)

( * ) Notice: Subject to any disclaimer, the term of this patent is extended or adjusted under 35 U.S.C. 154(b) by 398 days.

(21) Appl. No.: 15/042,387

(22) Filed: Feb. 12, 2016

(65) Prior Publication Data

US 2016/0164318 A1    Jun. 9, 2016

Related U.S. Application Data

(63) Continuation of application No. PCT/JP2014/065849, filed on Jun. 16, 2014.

(30) Foreign Application Priority Data

Aug. 28, 2013 (JP) ................................. 2013-176358

(51) Int. Cl.
*H01M 10/46* (2006.01)
*H02J 7/00* (2006.01)
(Continued)

(52) U.S. Cl.
CPC .......... *H02J 7/0021* (2013.01); *G01R 31/362* (2013.01); *G01R 31/3658* (2013.01); *G01R 31/026* (2013.01); *Y02T 10/7055* (2013.01)

(58) Field of Classification Search
CPC ....... H02J 7/0021; H02J 7/0026; H02J 7/0085
(Continued)

(56) References Cited

U.S. PATENT DOCUMENTS

| 5,391,948 A | 2/1995 | Izumita |
| 2008/0093924 A1 | 4/2008 | Matsumoto et al. |

(Continued)

FOREIGN PATENT DOCUMENTS

| JP | 61-93967 A | 5/1986 |
| JP | 4-81549 A | 3/1992 |
| JP | 2010-193589 A | 9/2010 |

OTHER PUBLICATIONS

Translation of JPH 0481549 (Mar. 1992).*

(Continued)

*Primary Examiner* — Edward Tso
(74) *Attorney, Agent, or Firm* — Sughrue Mion, PLLC

(57) ABSTRACT

A battery monitoring unit includes a control IC, a CPU, and a load circuit. In the inside of the battery monitoring unit, the control IC and the CPU each of which is a control circuit are connected to a unit internal ground that is common thereto. The load circuit is connected to a power ground different from the unit internal ground. In the inside of the battery monitoring unit, the power ground and the unit internal ground are connected with each other via a diode. The unit internal ground and the power ground are connected to an external ground that is common thereto via an electric wire extending from a first ground terminal and an electric wire extending from a second ground terminal, respectively.

3 Claims, 4 Drawing Sheets

(51) Int. Cl.
*G01R 31/36* (2006.01)
*G01R 31/02* (2006.01)

(58) Field of Classification Search
USPC ............... 320/107, 128, 132, 134, 136, 148
See application file for complete search history.

(56) References Cited

U.S. PATENT DOCUMENTS

| | | |
|---|---|---|
| 2008/0288161 A1 | 11/2008 | Ikushima et al. |
| 2009/0096293 A1 | 4/2009 | Nakayama et al. |
| 2009/0132188 A1 | 5/2009 | Watanabe |
| 2010/0209748 A1 | 8/2010 | Kudo et al. |
| 2011/0296218 A1* | 12/2011 | Kim .......................... H02J 3/32 |
| | | 713/323 |
| 2013/0057293 A1 | 3/2013 | Miyamoto |
| 2018/0040786 A1* | 2/2018 | Chen ..................... H01L 33/505 |

OTHER PUBLICATIONS

Communication dated Jan. 18, 2017, from the Korean Intellectual Property Office in counterpart Korean application No. 10-2016-7004998.
Communication dated Oct. 23, 2017, from the State Intellectual Property Office of People's Republic of China in counterpart Application No. 201480047173.7.
Communication dated Sep. 6, 2016, from the Japanese Patent Office in counterpart application No. 2015-534040.
International Search Report for PCT/JP2014/065849 dated Aug. 26, 2014.
Communication dated Mar. 8, 2017, issued from the Europe Patent Office in corresponding European Application No. 14841155.6.

* cited by examiner

DRAWBACK RESISTANT BATTERY MONITORING UNIT

CROSS-REFERENCE TO RELATED APPLICATION

This application is a continuation application of International Application PCT/JP2014/065849, filed on Jun. 16, 2014, and designating the U.S., the entire contents of which are incorporated herein by reference.

BACKGROUND OF THE INVENTION

1. Field of the Invention

The present invention relates to a battery monitoring unit capable of monitoring, for example, the state of a battery pack constituted of a plurality of battery cells.

2. Description of the Related Art

An electric vehicle and a plug-in hybrid vehicle (PHV) have been put into practical use, and various types of vehicles have been brought to the market. In such vehicles, electric power is utilized as the source of power.

Such a vehicle is equipped with a storage battery, especially a battery pack (hereinafter, simply referred to as "battery") constituted of a plurality of battery cells. Furthermore, a battery monitoring unit that controls and monitors the battery is provided to the vehicle. FIG. 1 illustrates a battery monitoring unit 101 having a conventional configuration. The battery monitoring unit 101 includes a control integrated circuit (IC) 100 that monitors and controls the battery, a central processing unit (CPU) 120 that controls the battery monitoring unit 101 as a whole, and a load circuit 130.

In such a battery monitoring system, a technique that achieves high reliability of the system is required. As such a technique, there has been a technique that adjusts, for example, a charging rate by a balance circuit, diagnoses overcharging or over-discharging to monitor the state of the battery cells, and enhance the reliability of a measuring system thus improving the reliability of the entire battery system (refer to Japanese Patent Application Laid-open No. 2010-193589).

Each of the components of the battery monitoring unit 101 in FIG. 1 is connected to a ground GND that is common to the components in the inside of the battery monitoring unit 101. When a disconnection has occurred in an electric wire (ground wire) extending to an external ground GND from a ground terminal 141 of the battery monitoring unit 101, the ground GND of each of the components such as a control IC 100 and a CPU 120 that constitute the battery monitoring unit 101 is in an isolated state. Such a state gives rise to the drawback that a reference potential is unstable, the control IC 100 and the like are abnormally operated, and the function of the battery monitoring unit 101 is eventually lost. When the function of the battery monitoring unit 101 is lost, there also gives rise to the drawback that a failure location is incapable of being identified. Also in the technique disclosed in Japanese Patent Application Laid-open No. 2010-193589, there still remains a similar drawback, and another technique has been required.

SUMMARY OF THE INVENTION

The present invention has been made under such circumferences, and it is an object of the present invention to provide a technique capable of solving the above-mentioned drawbacks.

In order to solve the above-mentioned drawbacks, a battery monitoring unit according to one aspect of the present invention controls and monitors a storage battery. The battery monitoring unit includes a control circuit; and a load circuit. Herein, in the inside of the battery monitoring unit, the control circuit is connected to a first ground, the load circuit is connected to a second ground different from the first ground, and the first ground and the second ground are connected with each other via a diode. The first ground and the second ground are connected to an external ground that is common thereto.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, modes for carrying out the present invention (referred to as "embodiments") are explained with reference to the accompanying drawings.

[1] First Embodiment

Figure 1:
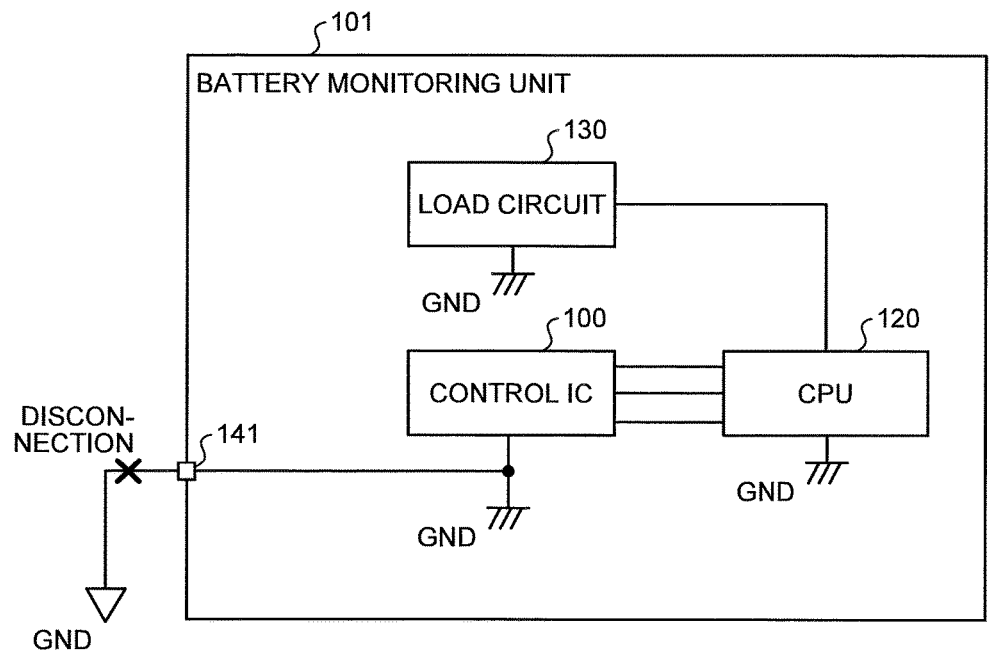
FIG. 1 is a block diagram of a battery monitoring unit according to the background art.
Figure 2:
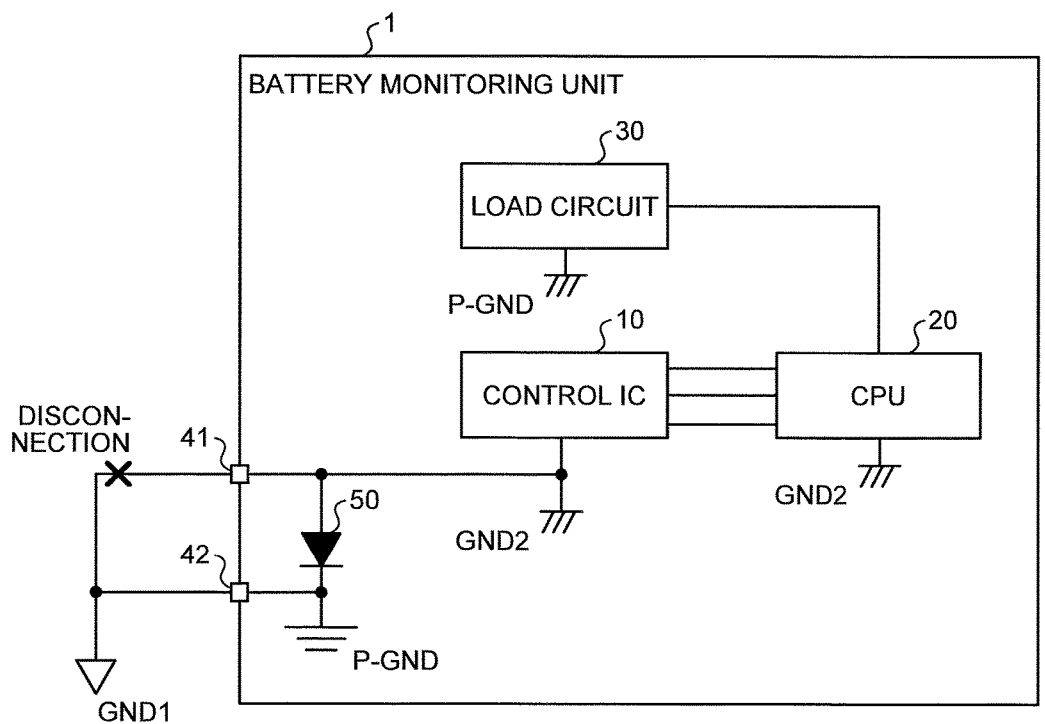
FIG. 2 is a block diagram of a battery monitoring unit according to a first embodiment of the invention.

FIG. 2 is a block diagram of a battery monitoring unit according to a first embodiment of the present invention.

A battery monitoring unit 1 in the first embodiment includes a control IC 10, a CPU 20, and a load circuit 30. In addition, the battery monitoring unit 1 includes a first ground terminal 41 and a second ground terminal 42 for connecting the battery monitoring unit 1 to an external ground (hereinafter, referred to as "external ground GND1"). As illustrated in FIG. 2, the first ground terminal 41 and the second ground terminal 42 are connected to the external ground GND1 that is common thereto.

In the inside of the battery monitoring unit 1, the control IC 10 and the CPU 20 each of which is a control circuit are connected to a ground wire (here, a unit internal ground GND2) that is common to the control IC 10 and the CPU 20.

The load circuit 30 is connected to a ground wire (power ground P-GND) different from the unit internal ground GND2.

Furthermore, in the inside of the battery monitoring unit 1, the power ground P-GND and the unit internal ground GND2 are connected with each other via a diode 50. The anode and the cathode of the diode 50 are connected to the ground wire of the unit internal ground GND2 and the ground wire of the power ground P-GND, respectively. FIG. 2 illustrates the diode 50 in the vicinity of the first ground terminal 41 and the second ground terminal 42 in the inside of the battery monitoring unit 1.

Furthermore, the unit internal ground GND2 is connected to the external ground GND1 via electric wires extending from the first ground terminal 41. In addition, the power ground P-GND is connected to the external ground GND1 via electric wires extending from the second ground terminal 42.

Here, when a disconnection has occurred in the electric wire extending from the first ground terminal 41 as illustrated in FIG. 2, the unit internal ground GND2 of the battery monitoring unit 1 is set to the electric potential via the diode 50 from the power ground P-GND (the electric potential of the unit internal ground GND2=the electric potential of the power ground P-GND+the forward voltage of the diode 50).

As a result, even when a disconnection has occurred, the electric potential of the unit internal ground GND2 varies from the normal electric potential of the unit internal ground GND2 while the unit internal ground GND2 is not in an isolated state. Therefore, the control IC 10 and the CPU 20 are capable of operating. Accordingly, even when a disconnection has occurred between the unit internal ground GND2 and the external ground GND1, the battery monitoring unit 1 is capable of monitoring abnormality of disconnection without losing its functions (communication function, for example).

[2] Second Embodiment

Figure 3:
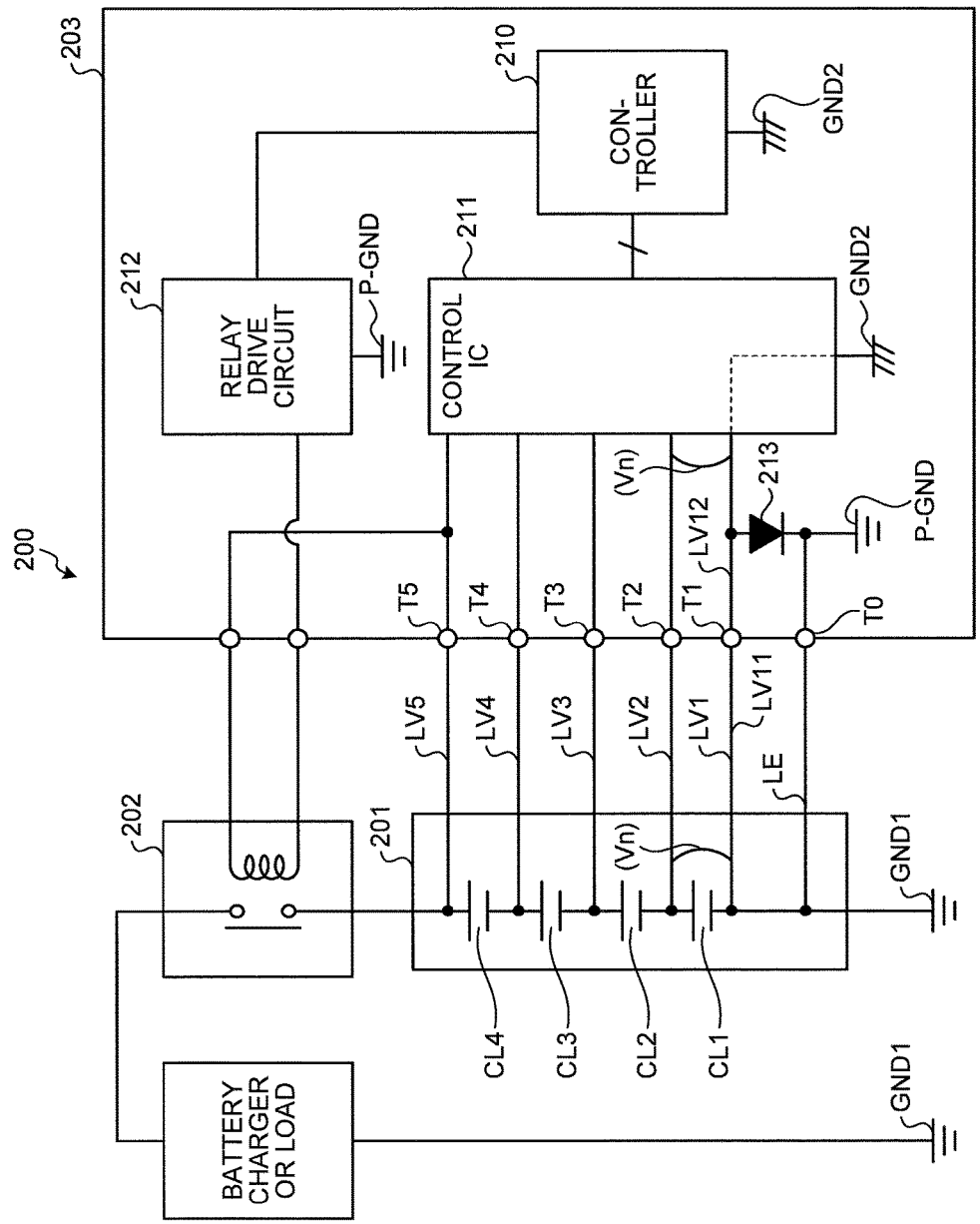
FIG. 3 is a schematic configuration block diagram of a battery monitoring system including a battery monitoring unit according to a second embodiment.

FIG. 3 is a schematic configuration block diagram of a battery monitoring system including a battery monitoring unit according to a second embodiment of the present invention.

A battery monitoring system 200 includes a battery unit 201 having a plurality of battery cells explained later, a relay 202 that performs interruption (cut) control on the charging current from a battery charger to the battery unit 201, or the discharging current with respect to a load of the battery unit 201, and a battery monitoring unit 203 that monitors the state of the battery unit 201, performs opening and closing control on the relay 202 and control on the charging state of the battery unit 201, and determines whether the connection state of the battery unit 201 is maintained normally.

The battery unit 201 includes a plurality of battery cells CL1 to CL4 that are connected with each other in series.

The relay 202 is constituted as a latch-type mechanical relay.

The battery monitoring unit 203 includes a controller 210 that controls the battery monitoring unit 203 as a whole, a control IC 211 that performs voltage detection of each of the battery cells CL1 to CL4 that constitute the battery unit 201 and cell balance control among the battery cells CL1 to CL4, and a relay drive circuit (load circuit) 212 that drives the relay 202 under the control of the controller 210.

In the above-mentioned configuration, a low-potential-side terminal of the battery cell CL1 and a first voltage detection terminal T1 of the control IC 211 are connected with each other via a first voltage detection line LV1, and a high-potential-side terminal of the battery cell CL1, a low-potential-side terminal of the battery cell CL2, and the second voltage detection terminal T2 of the control IC 211 are connected with each other via a second voltage detecting line LV2.

Here, the first voltage detection line LV1 is constituted of a first external voltage detection line LV11 that connects the low-potential-side terminal of the battery cell CL1 and the first voltage detection terminal T1 of the battery monitoring unit 203, and a first internal voltage detection line LV12 constituted as a wiring pattern on the board of the battery monitoring unit 203.

In the same manner as described above, a high-potential-side terminal of the battery cell CL2, a low-potential-side terminal of the battery cell CL3, and a third voltage detection terminal T3 of the control IC 211 are connected with each other via a third voltage detection line LV3.

Furthermore, a high-potential-side terminal of the battery cell CL3, a low-potential-side terminal of the battery cell CL4, and a fourth voltage detection terminal T4 of the control IC 211 are connected with each other via a fourth voltage detection line LV4.

In addition, a high-potential-side terminal of the battery cell CL4 and a fifth voltage detection terminal T5 of the control IC 211 are connected with each other via a fifth voltage detection line LV5.

In the above-mentioned configuration, the first voltage detection line LV1, which also functions as a first ground line, is connected to the external ground GND1.

Furthermore, the first voltage detection line LV1 and a ground line LE that functions as a second ground line are connected with each other via a diode 213 functioning as a voltage step-down unit. The ground line LE is connected to the power ground P-GND in the inside of the battery monitoring unit 203.

The control IC 211 has a resistor for cell balance and a switching transistor that are arranged in parallel with each of the battery cells CL1 to CL4, the resistor and the switching transistor being connected with each other in series and not illustrated in the drawings.

Furthermore, when a voltage detected with respect to each of the battery cells CL1 to CL4 assumes a value higher than a predetermined cell balance detecting voltage V1, the corresponding switching transistor is brought into an ON (closed) state to discharge the storage power of each of the corresponding battery cells CL1 to CL4 as a bypass current via the resistor for cell balance thus suppressing charging.

Even in a state in which the charging is suppressed, when the voltage of any one of the battery cells CL1 to CL4 reaches a predetermined overcharging detection voltage V2 (>V1), the control IC 211 stops the charging of the battery cells CL1 to CL4 that constitute the battery unit 201. However, even in this state, a cell balance operation via the above-mentioned resistor for cell balance is continued. As a result, the voltage of each of the battery cells CL1 to CL4 lowers gradually, and when the voltage reaches a predetermined cell balance cancellation voltage V3 (<V1), the corresponding switching transistor is brought into an OFF (open)-state thus finishing the cell balance operation.

Here, the unit internal ground GND2 of the battery monitoring unit 203 is a common ground to the controller 210, the control IC 211, and the like that function as a signal-processing system.

Furthermore, the power ground P-GND is constituted as a common ground to the relay drive circuit 212 and the like that function as a power supply system. In this case, the power ground P-GND is connected to the unit internal ground GND2 via the ground-line LE and the first voltage detection line LV1. Accordingly, the electric potential of the power ground P-GND is identical with the electric potential of the unit internal ground GND2.

$$P\text{-GND}=\text{GND2}$$

Furthermore, the diode 213 is connected in the forward direction from the unit internal ground GND2 (a first ground) toward the power ground P-GND (a second ground).

As a result, even when noises arise in an electrical signal flowing to the power ground P-GND (an electric current of around 1 ampere flows instantaneously at the time of the ON operation of the relay 202, for example), the noises are prevented from flowing into the unit internal ground GND2, thus preventing the operations of the controller 210 and the control IC 211 that are connected to the unit internal ground GND2 from being unstable.

Next, the operation when a disconnection has occurred in the first external voltage detection line LV11 is explained.

Figure 4:
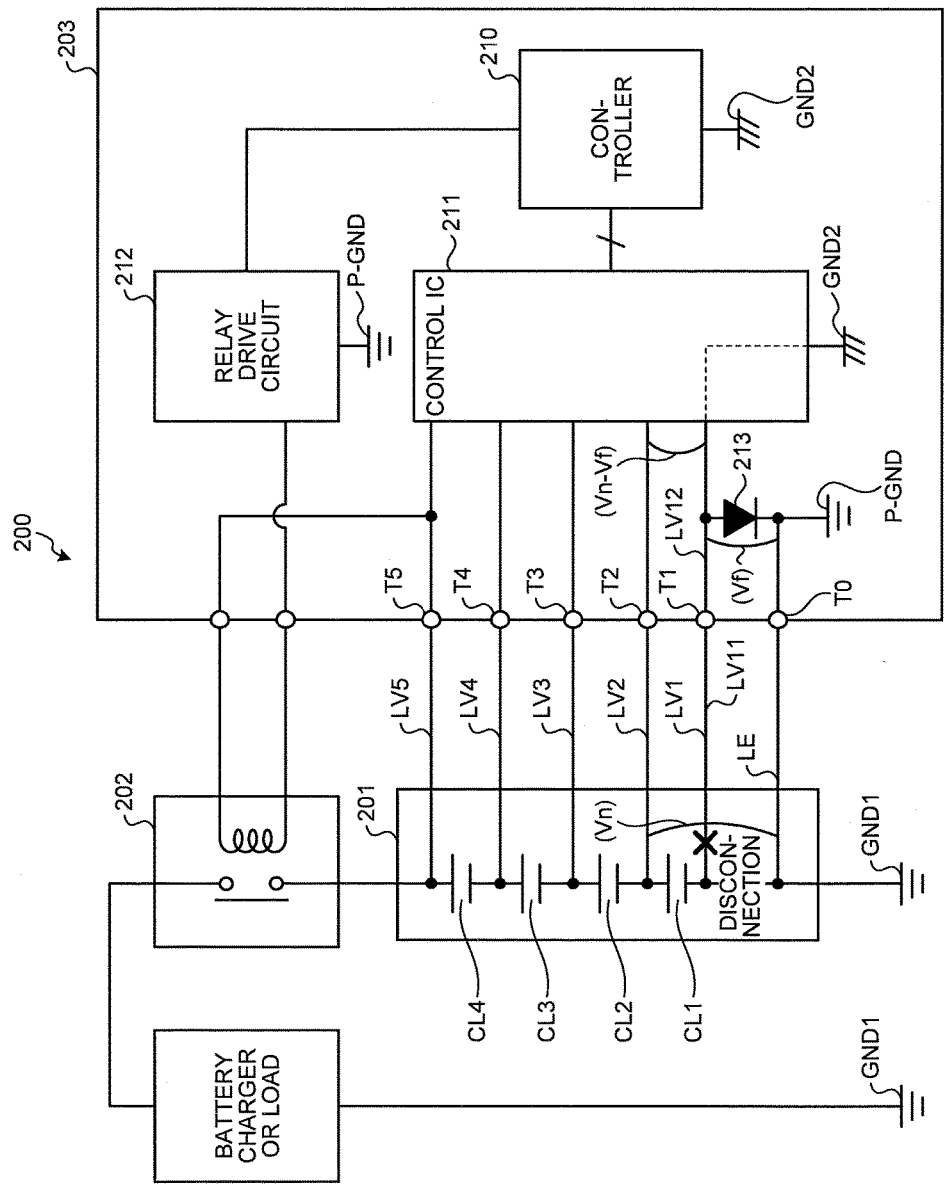
FIG. 4 is an explanatory view of operations when a disconnection has occurred.

FIG. 4 is an explanatory view of the operation when a disconnection has occurred.

As described above, in the stage where the first external voltage detection line LV11 is connected normally, the anode terminal and the cathode terminal of the diode 213 are in a short circuit state via the first external voltage detection line LV11 and the ground line LE, thus preventing the generation of the electric potential difference between the anode terminal and the cathode terminal.

Therefore, in the control IC 211, a voltage Vn of the battery cell CL1 that is in a normal state is detected to be the voltage of the battery cell CL1 that is detected via the first voltage detection line LV1 and the second voltage detection line LV2.

On the other hand, when a disconnection has occurred in the first external voltage detection line LV11 connected between the first voltage detection terminal T1 and the low-potential-side terminal of the battery cell CL1, the electric potential difference corresponding to a forward drop voltage VF of a diode is generated between the anode terminal and the cathode terminal of the diode. That is, the electric potential of the power ground P-GND assumes an electric potential lower than the electric potential of the unit internal ground GND2 by the forward drop voltage VF of the diode 213 (0.3 to 0.5V, for example).

As a result, a potential relation among the external ground GND1, the power ground P-GND, and the unit internal ground GND2 is expressed as follows by using the forward drop voltage VF of the diode.

$$GND1 = P\text{-}GND < GND2 = P\text{-}GND + VF$$

Therefore, the apparent voltage of the battery cell CL1 that is detected in the control IC 211 assumes, as illustrated in FIG. 4, a voltage (=Vn−VF) obtained by subtracting the forward drop voltage VF of the diode from the voltage Vn of the battery cell CL1 that is in a normal state.

In this manner, the control IC 211 detects that the voltage of the battery cell CL1 lowers steeply thus detecting that a disconnection has occurred in the first external voltage detection line LV11 without fail.

Furthermore, the electric potential of the unit internal ground GND2 of the battery monitoring unit 203 is, as described above, expressed as follows.

$$GND2 = P\text{-}GND + VF$$

Hence, although the electric potential difference between the unit internal ground GND2 and the external ground GND1 becomes larger than in the case where no disconnection has occurred, the electric potential of the unit internal ground GND2 is not in a high impedance (hi−Z) state caused in the case where the unit internal ground GND2 is in an isolated state.

Therefore, the operations of the control IC 211 and the controller 210 that constitute the control system are prevented from being unstable.

Accordingly, the battery monitoring unit 203 is, even when a disconnection has occurred between the unit internal ground GND2 and the external ground GND1, capable of operating normally and monitoring abnormality of disconnection without losing its functions such as a communication function.

In the explanation above, the diode is arranged in the forward direction between the unit internal ground GND2 and the power ground P-GND. However, as long as the operation of the control IC 211 is allowable, it is also possible to arrange the diode in the reverse direction.

Figure 5:
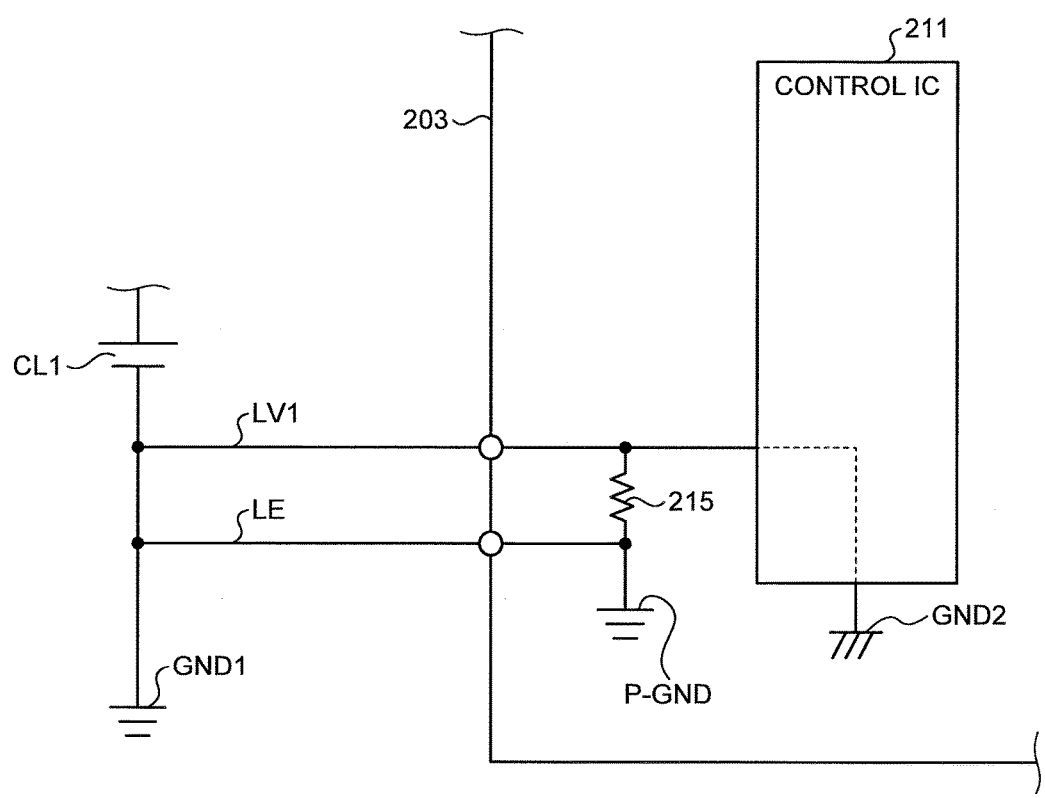
FIG. 5 is an explanatory view of a modification of the embodiments.

FIG. 5 is an explanatory view of a modification of the embodiments.

As illustrated in FIG. 5, it is also possible to use a resistor element (pull down resistor) 215 in place of the diode 213, the resistor element 215 being capable of generating the electric potential difference between the unit internal ground GND2 and the power ground P-GND in the same manner as the case of the diode 213. Also in this case, it is possible to detect a disconnection in the first external voltage detection line LV11 that functions as the first ground line without fail as in the above-described embodiments.

In the explanation above, the battery unit 201 includes the battery cells CL1 to CL4 that are connected with each other in series. However, it is also possible to use a configuration of n-parallel/m-series connection of battery cells.

According to the present invention, even when a disconnection has occurred between the battery monitoring unit and the external ground, it is possible to prevent the function of the battery monitoring unit from being lost.

The present invention has been explained heretofore in conjunction with the embodiments. Each embodiment merely constitutes one embodiment of the present invention. It should be noted that the present invention includes various modifications in the above-mentioned components and combination of these, which are also within the scope of the present invention.

What is claimed is:

1. A battery monitoring unit that is connected thereto a battery unit including a plurality of chargeable/dischargeable battery cells being connected with each other in series and performs charge-and-discharge control and monitoring of the battery unit, the battery monitoring unit comprising:
   a first circuit connected to a first ground base in the battery monitoring unit;
   a second circuit connected to a second ground base in the battery monitoring unit; and
   a diode connected between the first ground base and the second ground base, wherein
   the first ground base and the second ground base are commonly connected between a low-potential-side terminal of the battery unit and an external ground base via a first ground line and a second ground line, respectively,
   the first circuit detects a terminal voltage of the battery cell arranged on a lowermost potential side among the battery cells to determine whether a disconnection has occurred in the first ground line.

2. The battery monitoring unit according to claim 1, wherein
   the diode is connected in a forward direction from the first ground base toward the second ground base,
   wherein the forward direction is a direction pointing away from an anode towards a cathode.

3. The battery monitoring unit according to claim 2, wherein the first circuit determines that a disconnection has occurred when a terminal voltage of the battery cell arranged on a lowermost potential side in the plurality of battery cells is detected to be a voltage lowered by an amount corresponding to a forward drop voltage of the diode as compared with a case that no disconnection has occurred.

\* \* \* \* \*